(12) United States Patent
Ahn

(10) Patent No.: US 11,358,236 B2
(45) Date of Patent: Jun. 14, 2022

(54) MASK CHANGING UNIT FOR LASER BONDING APPARATUS

(71) Applicant: PROTEC CO., LTD., Gyeonggi-do (KR)

(72) Inventor: Geunsik Ahn, Seoul (KR)

(73) Assignee: PROTEC CO., LTD., Gyeonggi-do (KR)

( * ) Notice: Subject to any disclaimer, the term of this patent is extended or adjusted under 35 U.S.C. 154(b) by 620 days.

(21) Appl. No.: 16/436,943

(22) Filed: Jun. 11, 2019

(65) Prior Publication Data

US 2020/0215645 A1 Jul. 9, 2020

(30) Foreign Application Priority Data

Jan. 4, 2019 (KR) .......................... 10-2019-0001171

(51) Int. Cl.
| | |
|---|---|
| *G11C 11/00* | (2006.01) |
| *B23K 26/12* | (2014.01) |
| *H01L 23/00* | (2006.01) |
| *H01L 21/50* | (2006.01) |
| *B23K 26/066* | (2014.01) |
| *H01L 21/60* | (2006.01) |

(52) U.S. Cl.
CPC ........ *B23K 26/1224* (2015.10); *B23K 26/066* (2015.10); *H01L 21/50* (2013.01); *H01L 24/75* (2013.01); *H01L 24/81* (2013.01); *H01L 2021/60112* (2013.01); *H01L 2021/60292* (2013.01); *H01L 2224/75263* (2013.01); *H01L 2224/81203* (2013.01); *H01L 2225/06513* (2013.01)

(58) Field of Classification Search
None
See application file for complete search history.

(56) References Cited

U.S. PATENT DOCUMENTS

| | | | |
|---|---|---|---|
| 2007/0071056 A1* | 3/2007 | Chen | G01S 17/42 372/50.124 |
| 2011/0061884 A1* | 3/2011 | Wang | B81C 1/00269 156/272.8 |
| 2022/0052019 A1* | 2/2022 | Ko | B23K 37/0435 |

\* cited by examiner

*Primary Examiner* — Pho M Luu
(74) *Attorney, Agent, or Firm* — JCIPRNET

(57) ABSTRACT

Provided is a mask changing unit for a laser bonding apparatus, and more particularly, a mask changing unit for a laser bonding apparatus, wherein the mask changing unit supplies or changes a mask to or in the laser bonding apparatus for bonding a semiconductor chip to a substrate by using a laser beam.
The mask changing unit for a laser bonding apparatus, a plurality of masks that are used in performing laser bonding of a semiconductor chip to a substrate while the semiconductor chip is being pressed may be easily supplied to the laser bonding apparatus or changed in the laser bonding apparatus.

7 Claims, 4 Drawing Sheets

MASK CHANGING UNIT FOR LASER BONDING APPARATUS

CROSS-REFERENCE TO RELATED APPLICATION

This application claims the benefit of Korean Patent Application No. 10-2019-0001171, filed on Jan. 4, 2019, in the Korean Intellectual Property Office, the disclosure of which is incorporated herein in its entirety by reference.

TECHNICAL FIELD

One or more embodiments relate to a mask changing unit for a laser bonding apparatus, and more particularly, to a mask changing unit for a laser bonding apparatus, wherein the mask changing unit supplies or changes a mask to or in a laser bonding apparatus for bonding a semiconductor chip to a substrate by using a laser beam.

DESCRIPTION OF THE RELATED ART

As electronic products are becoming compact, a semiconductor chip of a flip-chip form in which no wire bonding is used is widely used. A plurality of electrodes in the form of solder bumps are formed on a lower surface of a semiconductor chip in the form of a flip chip, and the semiconductor chip is mounted on a substrate by bonding the electrodes to locations of corresponding solder bumps which are also formed on the substrate.

Examples of a method of mounting a semiconductor chip on a substrate by a flip chip method as described above include a reflow method and a laser bonding method. In the reflow method, a semiconductor chip is bonded to a substrate after disposing the semiconductor chip having solder bumps coated with a flux, on the substrate, and passing the semiconductor chip through a high-temperature reflow. According to the laser bonding method, a semiconductor chip including solder bumps coated with a flux is disposed on a substrate like in the reflow method, and the semiconductor chip is irradiated with a laser beam to transfer energy to the solder pumps such that the solder bumps are instantaneously melted and then hardened to thereby bond the semiconductor chip to the substrate.

Flip-chip type semiconductor chips that have recently been in use are decreasing in thickness to several tens of micrometers or less. A semiconductor chip having such a small thickness may be slightly bent or warped due to an internal stress of the semiconductor chip itself. When a semiconductor chip is deformed as above, the semiconductor chip may be bonded while some of the solder bumps of the semiconductor chip are not in contact with corresponding solder bumps of the substrate. This causes a defect in a semiconductor chip bonding process. Further, when temperatures of the semiconductor chip and the substrate rise instantaneously to bond the semiconductor chip to the substrate, the semiconductor chip or the substrate may be partially bent or warped due to a difference in coefficients of thermal expansion of materials of the semiconductor chip and the substrate, and this also causes a defect in the semiconductor chip bonding process.

To prevent deformation of a semiconductor chip in a process of performing a laser bonding process as above, using a mask that transmits through a laser beam and also presses the semiconductor chip may be considered. A laser bonding apparatus in which a mask as described above is used requires a mask changing unit for the laser bonding apparatus, which has a structure of effectively supplying or changing a mask.

SUMMARY

Problem to be Solved

One or more embodiments include a mask changing unit for a laser bonding apparatus, wherein the mask changing unit effectively supplies or changes, to or in the laser bonding apparatus, a plurality of masks that transmit through a laser beam and also pressurize a semiconductor chip.

Solution to the Problem

Additional aspects will be set forth in part in the description which follows and, in part, will be apparent from the description, or may be learned by practice of the presented embodiments.

Effects of the Invention

According to one or more embodiments, a mask changing unit for a laser bonding apparatus is included, wherein the mask changing unit is used by being connected to the laser bonding apparatus which bonds a semiconductor chip to a substrate by using a laser beam, the mask changing unit including: a plurality of masks including a mask main body having a plate shape and a plurality of transmission portions mounted on the mask main body and formed of a transparent material; a mask cassette in which the plurality of masks are accommodated in a vertical direction at certain intervals; a cassette holder in which the mask cassette is mounted; a cassette elevating unit lifting or lowering the mask holder; a mask transporting unit withdrawing a mask from the mask cassette and transferring the mask to the laser bonding apparatus or withdrawing a mask from the laser bonding apparatus and transporting the mask to the mask cassette to insert the mask into the mask cassette; and an inspection lamp arranged on a path of the mask being transported via the mask transporting unit to irradiate light to the mask and inspect the mask as to whether the mask is contaminated or not.

DETAILED DESCRIPTION

Hereinafter, a mask changing unit for a laser bonding apparatus, according to the present disclosure, will be described with reference to the attached drawings.

Figure 1:
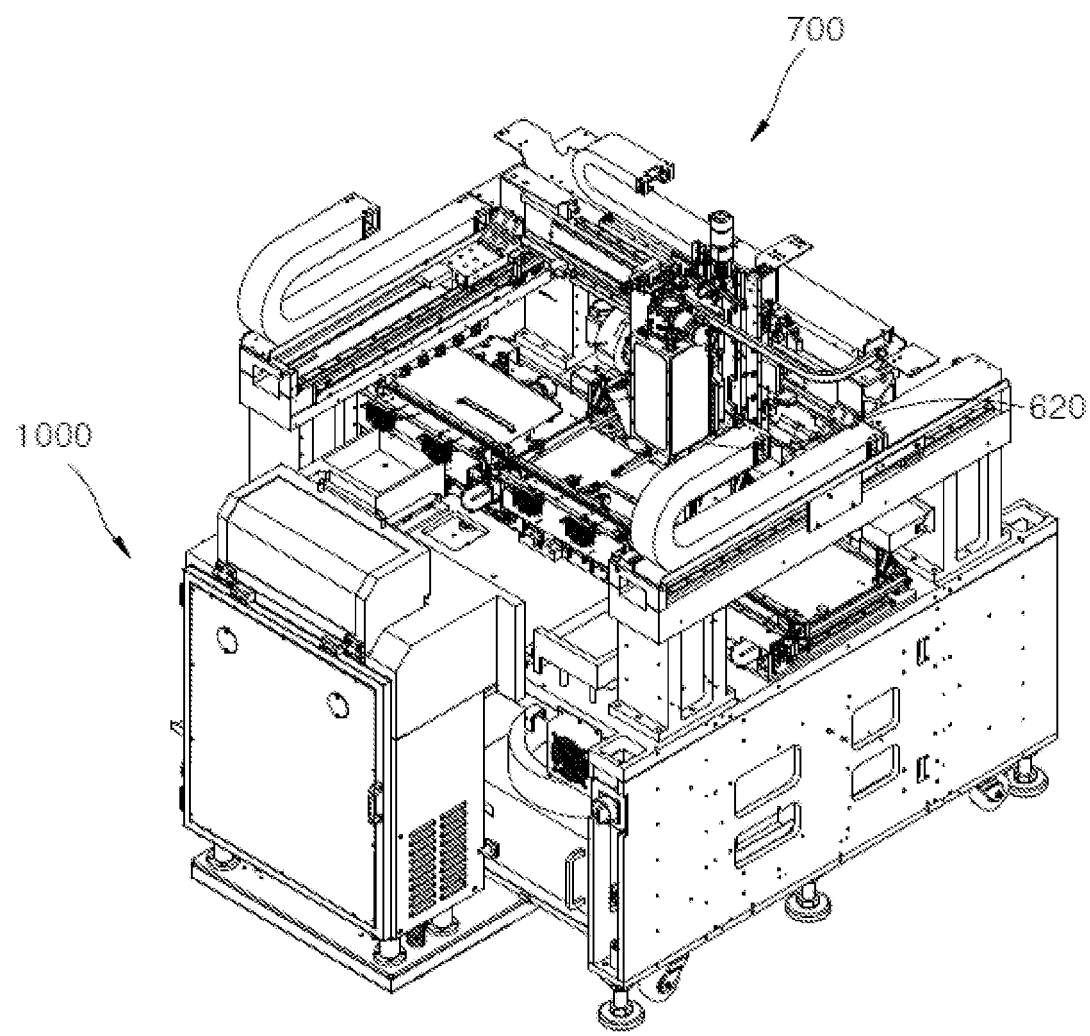
FIG. 1 is a perspective view of a mask changing unit for a laser bonding apparatus, according to an embodiment of the present disclosure, and a laser bonding apparatus to which the mask changing unit for a laser bonding apparatus is connected to be in use.
Figure 2:
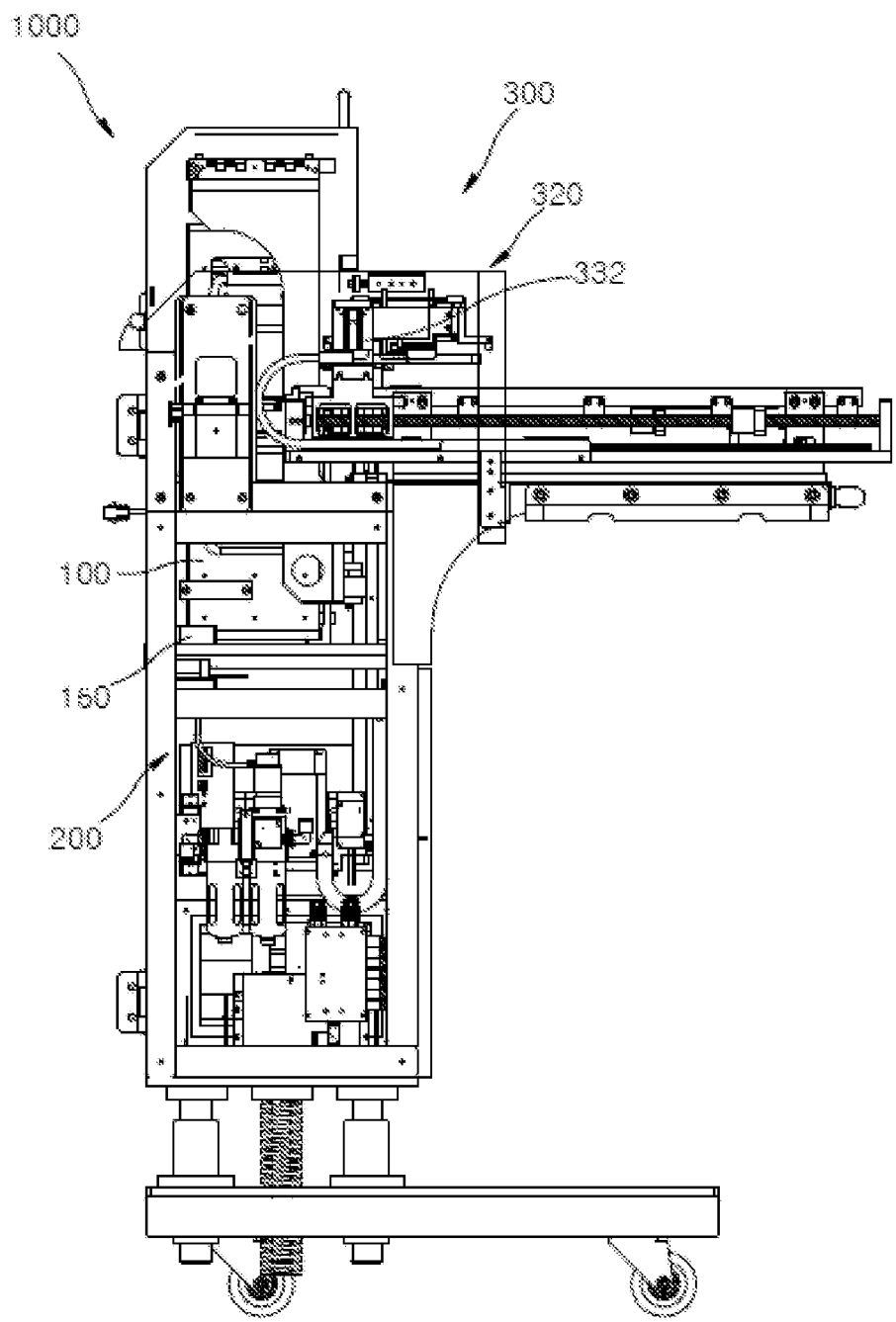
FIG. 2 is a side view of the mask changing unit for a laser bonding apparatus, illustrated in FIG. 1.

FIG. 1 is a perspective view of a mask changing unit 1000 for a laser bonding apparatus, according to an embodiment of the present disclosure, and a laser bonding apparatus 700 to which the mask changing unit 1000 for a laser bonding apparatus is connected to be in use. FIG. 2 is a side view of a mask changing unit 1000 for a laser bonding apparatus, illustrated in FIG. 1.

The mask changing unit 1000 for a laser bonding apparatus, according to the present embodiment, is used by being connected to the laser bonding apparatus 700 which bonds a semiconductor chip to a substrate in a flip-chip manner by using a laser beam. Solder bumps are formed on any one of or both the substrate and the semiconductor chip, and the semiconductor chip is bonded to the substrate as the solder bumps are instantaneously melted by the energy transferred via the laser beam and then hardened. As described above, the laser bonding apparatus 700 bonds the semiconductor chip by irradiating a laser beam to the semiconductor chip arranged on the substrate.

The mask changing unit 1000 for a laser bonding apparatus, according to the present disclosure, is an apparatus for supplying a mask 400 to the laser bonding apparatus 700 or changing the mask 400. The mask 400 is used to prevent deformation of a semiconductor chip by pressurizing the semiconductor chip in the laser bonding apparatus 700. By using the mask 400, a laser beam is transmitted through to transfer energy to the semiconductor chip and the semiconductor chip is also pressurized to prevent bending or warpage of the semiconductor chip at the same time. When a semiconductor chip is small and thin, the semiconductor chip may be bent or warped due to heat transferred via a laser beam. When the semiconductor chip is bent or warps, some of the solder bumps of the semiconductor chip may not be bonded to the substrate. To prevent this problem, the mask 400 is used to press the semiconductor chip against the substrate to thereby keep the semiconductor flat and thus prevent bending or warpage of the semiconductor chip, and is also used to transmit through a laser beam through the semiconductor chip at the same time.

Figure 3:
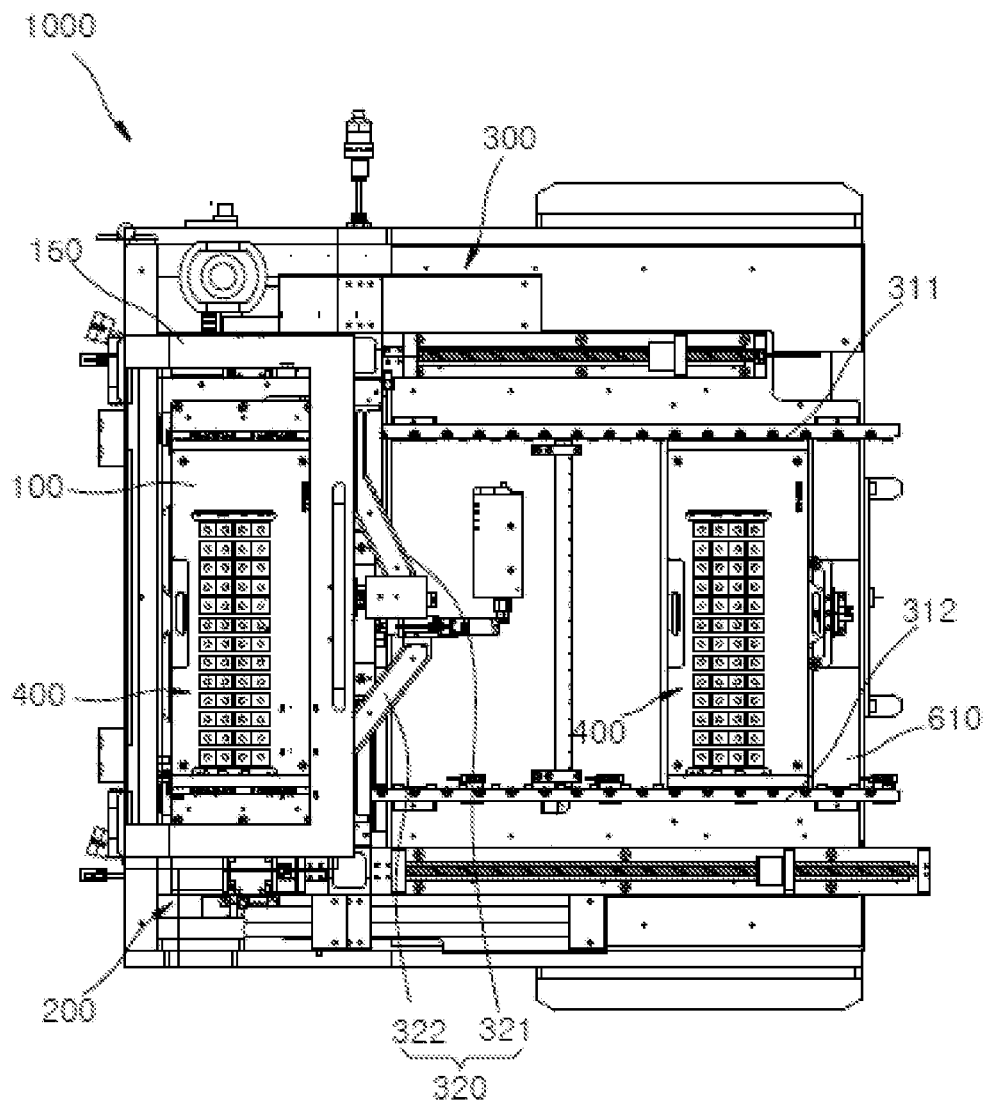
FIG. 3 is a plan view of the mask changing unit for a laser bonding apparatus, illustrated in FIG. 1.

Referring to FIGS. 1, 2 and 3, the mask changing unit 1000 for a laser bonding apparatus, according to the present embodiment, includes a plurality of masks 400, a mask cassette 100, a cassette holder 150, and a cassette elevating unit 200.

Each of the masks 400 has a plate shape and includes a mask main body 410 and a plurality of transmission portions 440. A structure of the mask 400 will be described in detail later.

The plurality of masks 400 are accommodated in the mask cassette 100. The mask cassette 100 is configured to accommodate the plurality of masks 400 in a vertical direction at certain intervals. In addition, the mask cassette 100 is configured to be easily transported while including the plurality of masks 400 accommodated in the mask cassette 100.

The mask cassette 100 is mounted in the cassette holder 150. After accommodating the masks 400 in the mask cassette 100 and transporting the same, a user mounts the plurality of masks 400 in the cassette holder 150 to use the masks 400.

The cassette elevating unit 200 lifts or lowers the cassette holder 150. The cassette elevating unit 200 adjusts a height of the cassette holder 150 to be at a height at which the mask 400 is withdrawn or introduced.

The mask transporting unit 300 transports the mask 400 between the cassette holder 150 and the laser bonding apparatus 700. The mask transporting unit 300 includes a pair of guide rails 311 and 312 and a mask transporting module 320.

The pair of guide rails 311 and 312 extend horizontally to connect the cassette holder 150 and the laser bonding apparatus 700. The pair of guide rails 311 and 312 support both ends of the mask 400 moving between the cassette holder 150 and the laser bonding apparatus 700. A plurality of rollers are installed on each of the guide rails 311 and 312 to support a lower surface of the mask 400. The mask 400 is moved by being slid by the rollers of the guide rails 311 and 312.

The mask transporting module 320 pulls the mask 400 in a horizontal direction to transport the same to the laser bonding apparatus 700 or in an opposite direction to the mask cassette 100.

The mask transporting module 320 of the mask changing unit 1000 for a laser bonding apparatus, according to the present embodiment, includes a first transporting member 321 and a second transporting member 322 as illustrated in FIG. 3. The first transporting member 321 and the second transporting member 322 each include a ball-screw to be operated in a horizontal direction.

The first transporting member 321 transports the mask 400 on a path between the cassette holder 150 and the guide rails 311 and 312. The second transporting member 322 transports the mask 400 on a path between the laser bonding apparatus 700 and the guide rails 311 and 312. The first transporting member 321 withdraws the mask 400 from the mask cassette 100 to place the same on the guide rails 311 and 312 or pushes the mask 400 arranged on the guide rails 311 and 312 to the mask cassette 100. The second transporting member 322 pushes the mask 400 arranged on the guide rails 311 and 312 to the laser bonding apparatus 700 or withdraws the mask 400 from the laser bonding apparatus 700 and places the same on the guide rails 311 and 312.

Referring to FIG. 3, an inspection lamp 610 is installed at a lower portion between the pair of the guide rails 311 and 312. The inspection lamp 610 is configured to irradiate light upwardly. When the inspection lamp 610 is turned on, light is irradiated to the mask 400 arranged above the inspection lamp 610. The light irradiated from the inspection lamp 610 passes by the transmission portions 440 of the mask 400 to be transmitted upwards. Accordingly, an inspection camera 620 arranged above the mask 400 may better determine whether the mask 400 is contaminated or not.

Figure 4:
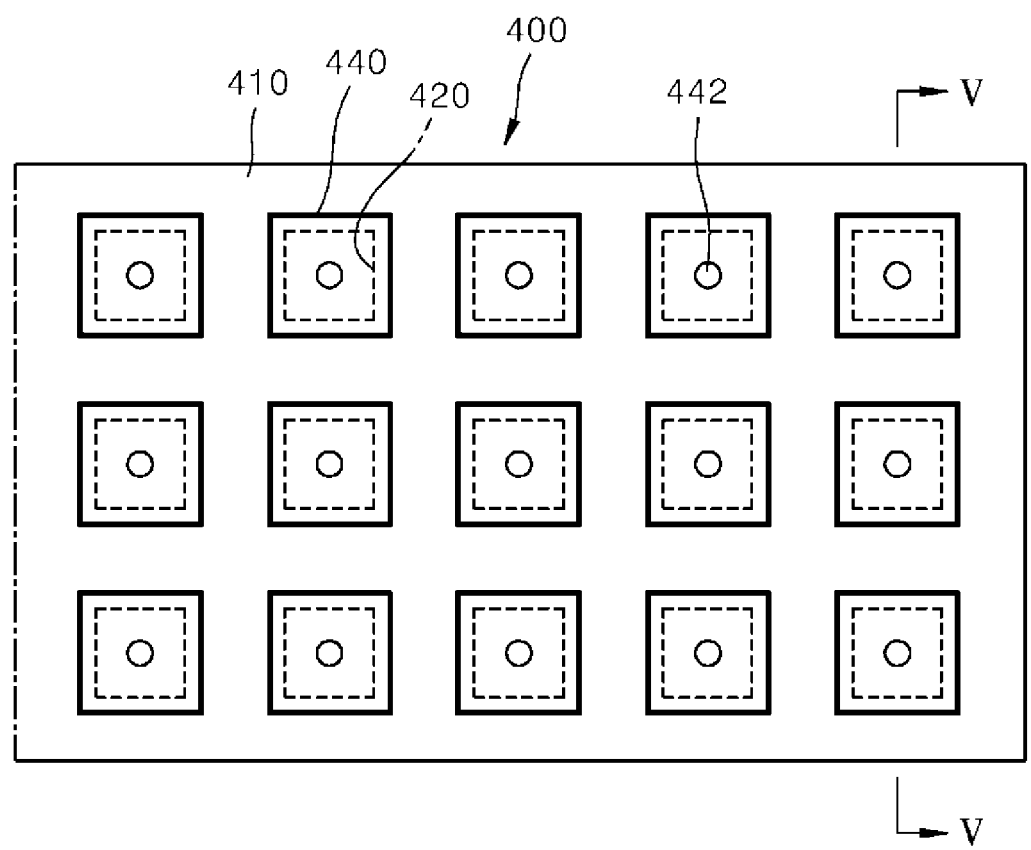
FIG. 4 is a plan view of a mask used in the mask changing unit for a laser bonding apparatus, illustrated in FIG. 1.
Figure 5:
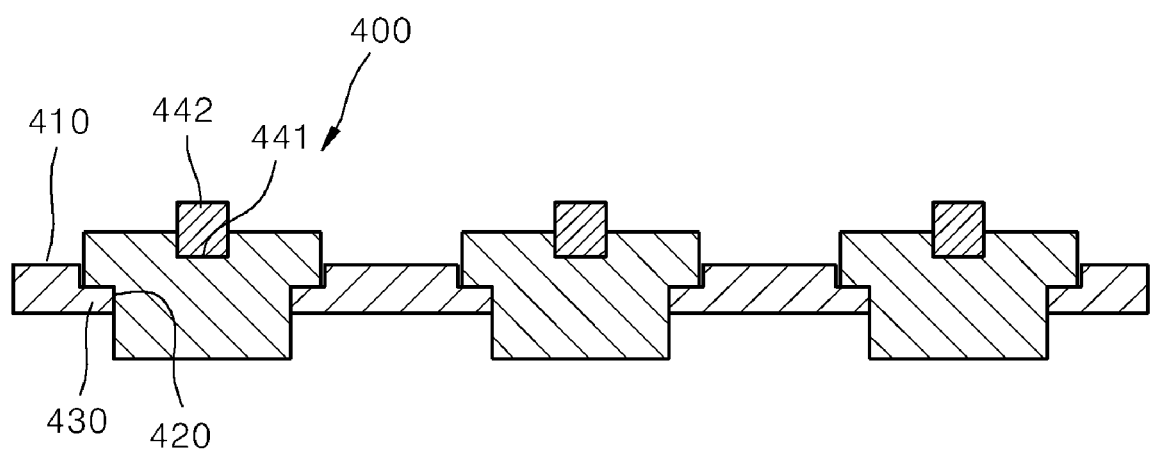
FIG. 5 is a cross-sectional view of the mask illustrated in FIG. 4 taken along line V-V.

Referring to FIGS. 4 and 5, a plurality of transmission holes 420 are formed in the mask main body 410 of the mask 400, and the plurality of transmission portions 440 are respectively inserted into the plurality of transmission holes 420.

A protrusion 430 protruding inwardly is formed in each of the transmission holes 420 of the mask 400. The transmission portions 440 are respectively inserted into the transmission holes 420 to be held by being caught on the protrusion 430. By lowering the mask 400 relative to the substrate or lifting the substrate relative to the mask 400, a lower surface of the transmission portions 440 comes into contact with an upper surface of the semiconductor chip arranged on the substrate, and the load of the transmission portions 440 is transferred to the semiconductor chip. As the mask 400 and the substrate approach each other more closely, each of the transmission portions 440 is lifted from the mask main body 410 via the semiconductor chip. A weight groove 441 that is concave is formed in an upper surface of the transmission portions 440, and a weight 442 is held in the weight groove 441. A load for pressurizing the semiconductor chip may be further increased by using the weight 442.

Hereinafter, an operation of the mask changing unit 1000 for a laser bonding apparatus, configured as described above will be described.

A user accommodates the masks 400 in the mask cassette 100 sequentially in a vertical direction to mount the mask 400 in the cassette holder 150.

The cassette elevating unit 200 lifts or lowers the cassette holder 150 to adjust the cassette holder 150 to be at an appropriate height. The cassette elevating unit 200 adjusts a height of the cassette holder 150 such that the mask 400 to be withdrawn is at an equal height to the guide rails 311 and 312 of the mask transporting unit 300.

The first transporting member 321 of the mask transporting module 320 withdraws the mask 400 from the mask cassette 100 and transports the mask 400 such that the mask 400 is slid up to an appropriate position on the guide rails 311 and 312. When the first transporting member 321 is moved to a position not interfering with the second transporting member 322, the second transporting member 322 approaches the mask 400 on the guide rails 311 and 312 and transports the mask 400 to the laser bonding apparatus 700 along the guide rails 311 and 312.

The laser bonding apparatus 700 places a substrate below the mask 400 and lifts the substrate. A semiconductor chip on the substrate comes into contact with the lower surface of the transmission portions 440 of the mask 400. By further lifting the substrate, the transmission portions 440 are lifted relative to the mask main body 410 via the semiconductor chip. As the load of the transmission portions 440 and the weight 442 is transferred to the semiconductor chip, the transmission portions 440 pressurize the semiconductor chip.

By irradiating a laser beam in this state, the laser beam passes through the transmission portions 440 to be transferred to the solder bumps of the semiconductor chip. As the solder bumps are melted and then hardened, the semiconductor chip is bonded to the substrate. The laser bonding apparatus 700 lowers the substrate to discharge the same, and receives a next substrate and repeats the above-described process.

While repeating the above-described process, when contaminant particles adhere to the transmission portions 440 of the mask 400, transmission of a laser beam may be impeded, thus degrading the quality of a laser bonding operation. To prevent this problem, the mask 400 may be changed by inspecting whether the mask 400 is contaminated or the mask 400 may be changed every period.

An operation of inspecting the mask 400 or changing the mask 400 to this end will be described below.

The second transporting member 322 withdraws the mask 400 located in the laser bonding apparatus 700 and transports the mask 400 along the guide rails 311 and 312 to be above the inspection lamp 610. When the inspection lamp 610 is turned on in this state, light emitted from the inspection lamp 610 passes by the transmission portions 440 to be irradiated upwardly. In this state, by capturing an image of the mask 400 from above the mask 400 by using the inspection camera 620 and analyzing the captured image, whether the mask 400 is contaminated or not may be effectively identified. The inspection camera 620 capturing an image of the mask 400 may be installed in the laser bonding apparatus 700 or in the mask changing unit 1000 for a laser bonding apparatus, according to the present disclosure. As the mask changing unit 1000 for a laser bonding apparatus, according to the present embodiment, includes the inspection lamp 610 at the lower portion between the guide rails 311 and 312, light may be effectively irradiated to the mask 400 without interfering with a transport path of the mask 400. The inspection camera 620 may effectively capture an image for identifying whether the transmission portions 440 are contaminated, by using illumination of the inspection lamp 610.

When the mask 400 is not contaminated as a result of inspecting the image captured using the inspection camera 620, the second transporting member 322 transports the mask 400 to the laser bonding apparatus 700 so that the mask 400 can be reused.

When the mask 400 is contaminated as a result of inspecting the image captured using the inspection camera 620, the mask transporting unit 300 and the cassette elevating unit 200 changes the mask 400.

The cassette elevating unit 200 adjusts a position of the cassette holder 150 in a vertical direction such that an empty position of the mask cassette 100 is at an equal height to the guide rails 311 and 312. The mask transporting unit 300 pushes a contaminated mask 400 into the empty space of the mask cassette 100.

The cassette elevating unit 200 adjusts the height of the cassette holder 150 again such that a height of a new mask 400 of the mask cassette 100 is at an equal height to the guide rails 311 and 312. The mask transporting unit 300 withdraws the new mask 400 and transfers the same to the laser bonding apparatus 700.

The mask 400 being used in the laser bonding apparatus 700 may be replaced with a new mask 400 in the above-described manner.

In addition, according to the mask changing unit 1000 for a laser bonding apparatus, according to the present disclosure, the plurality of masks 400 may be accommodated in the mask cassette 100 and the masks 400 may be automatically replaced according to necessity or regularly as described above, thus enhancing productivity of a laser bonding operation.

In addition, according to the mask changing unit 1000 for a laser bonding apparatus, according to the present disclosure, as the mask 400 having the structure as described above is supplied to the laser bonding apparatus 700, the quality of a laser bonding process may be enhanced by preventing deformation of a semiconductor chip.

While the present disclosure has been described with reference to preferred embodiments, the scope of the present disclosure is not limited to the above-described and illustrated structures.

For example, the mask 400 having other various structures than the structure illustrated in FIGS. 4 and 5 may also be used. In addition, a mask in which no weight groove is formed in a transmission portion of the mask and no weight is included may also be used. A protrusion of the mask may also have other various shapes than that illustrated in the drawing.

The mask transporting unit 300 transporting the mask 400 may also have other various configurations than the structure described and illustrated above. In the present embodiment, the mask transporting module 320 configured to transport the mask 400 in two stages by using the first transporting member 321 and the second transporting member 322 to effectively extend a path whereby the mask 400 is transported, is used. However, a mask transporting unit having other various structures to transport a mask between a mask cassette and a laser bonding apparatus may also be used.

| [Explanation of Symbols] | |
| --- | --- |
| 100: mask cassette | 150: cassette holder |
| 200: cassette elevating unit | 300: mask transporting unit |
| 311, 312: guide rail | 320: mask transporting module |
| 321: first transporting member | 322: second transporting member |
| 610: inspection lamp | 620: inspection camera |
| 400: mask | 410: mask main body |
| 420: transmission hole | 430: protrusion |
| 440: transmission portion | 441: weight groove |
| 442: weight | 700: laser bonding apparatus |

What is claimed is:

1. A mask changing unit for a laser bonding apparatus, wherein the mask changing unit is used by being connected to the laser bonding apparatus which bonds a semiconductor chip to a substrate by using a laser beam, the mask changing unit comprising:
a plurality of masks comprising a mask main body having a plate shape and a plurality of transmission portions mounted on the mask main body and formed of a transparent material;
a mask cassette in which the plurality of masks are accommodated in a vertical direction at certain intervals;
a cassette holder in which the mask cassette is mounted;
a cassette elevating unit lifting or lowering the mask holder;
a mask transporting unit withdrawing a mask from the mask cassette and transferring the mask to the laser bonding apparatus or withdrawing a mask from the laser bonding apparatus and transporting the mask to the mask cassette to insert the mask into the mask cassette; and
an inspection lamp arranged on a path of the mask being transported via the mask transporting unit to irradiate light to the mask and inspect the mask as to whether the mask is contaminated or not.

2. The mask changing unit of claim 1, wherein the mask transporting unit comprises:
a pair of guide rails extending horizontally between the cassette holder and the laser bonding apparatus; and
a mask transporting module transporting the mask by pushing the mask along the guide rails.

3. The mask changing unit of claim 2, wherein the mask transporting module of the mask transporting unit comprises:
a first transporting member transporting the mask on a path between the cassette holder and the guide rails; and
a second transporting member transporting the mask on a path between the laser bonding apparatus and the guide rails.

4. The mask changing unit of claim 3, wherein the inspection lamp is installed at a lower portion of the guide rails to irradiate light upwardly.

5. The mask changing unit of claim 1, wherein a plurality of transmission holes are formed in the mask main body of the mask, and
the plurality of transmission portions of the mask are respectively inserted into the plurality of transmission holes.

6. The mask changing unit of claim 5, wherein the mask further comprises a protrusion protruding inwardly in the plurality of transmission holes,
wherein the plurality of transmission portions are respectively inserted into the plurality of transmission holes of the mask to be held by being caught on the protrusion.

7. The mask changing unit of claim 6, wherein a weight groove that is concave is formed in an upper surface of the plurality of transmissions portions of the mask, and
the mask further comprises a weight that is held on the weight groove of the plurality of transmission portions to increase a weight whereby a plurality of semiconductor chips arranged on the substrate are pressurized.

* * * * *